(12) United States Patent
Bagga et al.

(10) Patent No.: US 11,703,549 B2
(45) Date of Patent: Jul. 18, 2023

(54) SYSTEMS AND METHODS FOR GROUND FAULT DETECTION

(71) Applicants: Sunny Bagga, Corona, CA (US); Brian J. Cadwell, Pasadena, CA (US); Shaun Mark Goodwin, East New Market, MD (US)

(72) Inventors: Sunny Bagga, Corona, CA (US); Brian J. Cadwell, Pasadena, CA (US); Shaun Mark Goodwin, East New Market, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 479 days.

(21) Appl. No.: 16/863,308

(22) Filed: Apr. 30, 2020

(65) Prior Publication Data

US 2021/0341547 A1    Nov. 4, 2021

(51) Int. Cl.
| | |
|---|---|
| *G01R 31/52* | (2020.01) |
| *G01R 31/28* | (2006.01) |
| *G01R 31/3193* | (2006.01) |
| *H02H 3/32* | (2006.01) |
| *H02H 3/16* | (2006.01) |
| *G01R 31/319* | (2006.01) |
| *G01R 31/08* | (2020.01) |

(52) U.S. Cl.
CPC ........... *G01R 31/52* (2020.01); *G01R 31/083* (2013.01); *G01R 31/2834* (2013.01); *G01R 31/31905* (2013.01); *G01R 31/31932* (2013.01); *H02H 3/16* (2013.01); *H02H 3/32* (2013.01)

(58) Field of Classification Search
None
See application file for complete search history.

(56) References Cited

U.S. PATENT DOCUMENTS

| | | | |
|---|---|---|---|
| 4,417,202 A | * | 11/1983 | Pascoe ................... G01R 31/52 340/650 |
| 4,542,432 A | | 9/1985 | Nichols, III et al. |
| 5,805,397 A | | 9/1998 | MacKenzie |

(Continued)

OTHER PUBLICATIONS

Higashihama Hirotada et al.; Electric Leakage Detection Device; Date Published Dec. 2, 2004; JP 2004343972 A; (Year: 2004).*

(Continued)

*Primary Examiner* — Nasima Monsur
(74) *Attorney, Agent, or Firm* — Tarolli, Sundheim, Covell & Tummino L.L.P.

(57) ABSTRACT

A ground fault detection circuit can include a band-pass filter that can have a first node and a second node that can be coupled to an earth ground. The first node can be coupled to a local ground of an automatic test equipment (ATE) system for an electrical device that can be coupled via at least one wire to the ATE. The band-pass filter can be configured to pass and amplify a test current signal established at the first node in response to a coupling of one of a conductor of the at least one wire carrying the test current signal to the local ground, and a conductive element of the electrical device carrying the test current signal to the local ground. A fault alert signal can be provided to provide an indication of ground fault based on a comparison of the amplified test current signal.

19 Claims, 4 Drawing Sheets

(56) References Cited

U.S. PATENT DOCUMENTS

| 9,921,259 B2 | 3/2018 | Tsuchiya et al. | |
| 2013/0063152 A1* | 3/2013 | Kasashima | G01R 31/52 |
| | | | 324/509 |
| 2018/0128867 A1* | 5/2018 | Zhang | H02H 3/335 |

OTHER PUBLICATIONS

Kalgren Patrick et al. ; Systems and Methods for Predicting Failure of Electronic Systems and Assessing Level of Degradation and Remaining Useful Life; WO 2008036921 A2; Date Published Mar. 27, 2008; (Year: 2008).*

* cited by examiner

SYSTEMS AND METHODS FOR GROUND FAULT DETECTION

GOVERNMENT INTEREST

The invention was made under Government Contract. Therefore, the US Government has rights to the invention as specified in that contract.

TECHNICAL FIELD

The present disclosure relates to ground fault detection. More particularly, the present disclosure relates to a ground fault detector for an automatic test equipment (ATE) system.

BACKGROUND

An electric circuit provides a path for electric current to travel that is composed of conductors (e.g., wires), conducting devices, and a source of electromotive force that drives the current around the circuit. Current flows in the electric circuit in accordance with several laws, including Ohm's law, which provides that an amount of current flowing in the electrical circuit made up of pure resistances can be directly proportional to the electromotive force impressed on the electrical circuit and inversely proportional to a total resistance of the electrical circuit. A "ground fault" is an undesirable condition in the electrical circuit, where the electrical current in the circuit flows or "leaks" outside of an intended flow path.

Automatic test equipment or automated test equipment (ATE) is any apparatus that performs tests on a device, known as the device under test (DUT), equipment under test (EUT) or unit under test (UUT), using automation to quickly perform measurements and evaluate the test results. An ATE can be a simple computer-controlled digital multimeter, or a complicated system containing dozens of complex test instruments (real or simulated electronic test equipment) capable of automatically testing and diagnosing faults in sophisticated electronic packaged parts or on wafer testing, including system on chips and integrated circuits.

SUMMARY

In an example, a ground fault detection circuit includes a band-pass filter that can have a first node and a second node. The first node can be coupled to a local ground of a test heading of an automatic test equipment (ATE) system for an electrical device that can be coupled via at least one wire to a test instrument of the ATE. The second node can be coupled to an earth ground. The band-pass filter can be configured to pass and amplify a test current signal established at the first node in response to one of a coupling of a conductor of the at least one wire carrying the test current signal to the local ground, and a coupling of a conductive element of the electrical device carrying the test current signal to the local ground. The ground fault detection circuit can further include a comparator circuit that can be configured to compare the amplified test current signal to a threshold and output a fault alert signal to provide an indication of a ground fault based on the comparison.

In another example, a method for detecting a ground fault condition can include generating, at a current source of an ATE system, a test current signal having a given frequency and providing the test current signal via a wire to a device under test (DUT) coupled to a test head of the ATE system. The method can further include receiving, at a first input node of a ground fault detection circuit that is coupled to a local ground of the ATE system, the current signal in response to one of a coupling of a conductor of the at least one wire carrying the test current signal to the local ground and a coupling of a conductive element of the DUT carrying the test current signal to the local ground. The ground fault detection circuit can include a second input node that can be coupled to an earth ground to provide a signal reference for the current signal. The test current signal can be contaminated with noise. The method can further include applying the test current signal to an active band-pass filter of the ground fault detection circuit to attenuate the noise and provide an amplified test current signal. The frequency of the test current signal can be within a band-pass frequency range of the active band-pass filter. The method can further include outputting, at an output of the ground fault detection circuit, a fault alert signal indicative of a ground fault condition based on a comparison of the second amplified test current signal relative a threshold.

In a further example, a system can include a current source that can be configured to generate a test current signal. The test current signal can be supplied via at least one wire to a device under test (DUT) coupled to a test head of an automatic test equipment (ATE) system. The system can further include a ground fault detector that can be coupled to a local ground of the test head, the ground fault detector can be configured to receive the test current signal in response to one of a coupling of a conductor of the at least one wire carrying the test current signal to the local ground and a coupling of a conductive element of the DUT carrying the test current signal to the local ground. The ground fault detector can be further configured to output a fault alert signal to provide an indication of a ground fault based on the test current signal.

DETAILED DESCRIPTION

Figure 1:
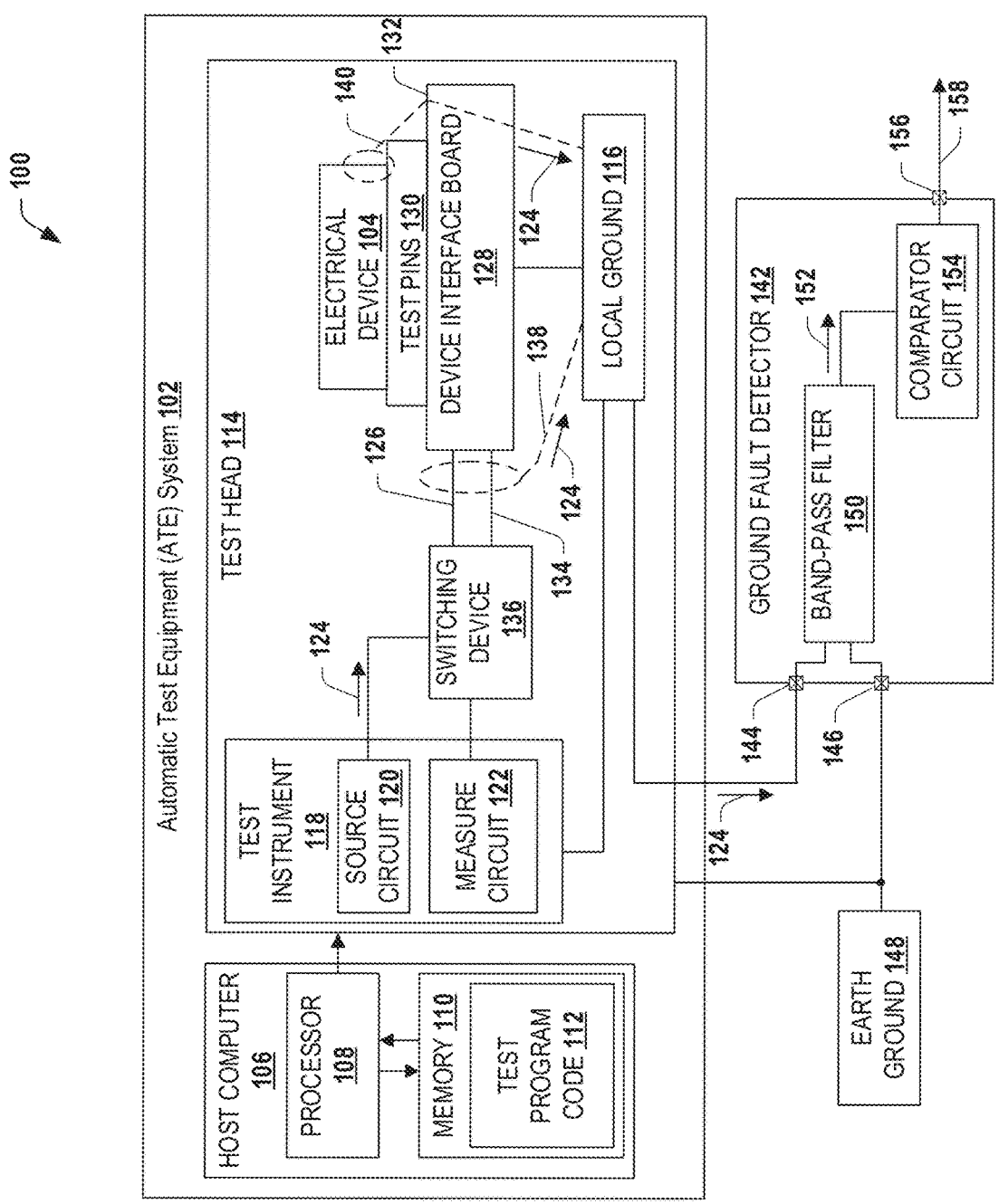
FIG. 1 illustrates an example of an automatic testing equipment (ATE) environment.

The present disclosure relates to ground fault detection. Examples are presented herein with respect to a ground fault detection in an automatic test equipment (ATE) environment. However, the examples herein should not be construed or limited to ATE applications (e.g., device under test (DUT) testing). A ground fault detection system as described herein can be employed in any application in which the ground fault detection system can be coupled to a local ground and an earth ground. Exemplary applications can include computer systems, power systems, transformer systems, etc. The ground fault detection system as described herein can be employed to detect unwanted coupling of wires, transmission lines, circuits, etc. to a local ground, such that ground fault conditions can be readily identified.

Ground is a point of reference from which an electrical potential can be measured. An electrical potential difference can exist between different grounds, such that a voltage can be established there between. The term "earth ground" as used herein can refer to earth. As such, an electrical potential of the earth ground can be equal to or substantially equal to (e.g., within 5-10% or less) to an electrical potential of the earth. The term "local ground" as used herein can refer to a conductive feature (e.g., metal body of a housing, such as a chassis, a metal layer in a semiconductor device, etc.) that can be a reference point for a corresponding system (e.g., device, apparatus, circuit, etc.). The local ground can have a different electrical potential than the earth ground. In some examples, the local ground can have a greater electrical potential than the earth ground (e.g., once a current is passed through the local ground). In some examples, the local ground can correspond to a chassis ground or a signal ground (e.g., a zero electrical potential node).

In some examples, the ground fault detection system can be employed to detect for ground fault conditions with respect to an automatic test equipment (ATE) system or an electrical device. The ATE system can be employed to test a performance of the electrical device (e.g., such as a microelectronic device). In some examples, the ground fault detection system can be configured to detect ground fault conditions caused by wiring of the ATE system or defective conductive elements of an electrical device. In an example, the electrical device is a device under test (DUT). The ground fault detection system can be coupled to a local ground of the ATE system and to an earth ground to which the ATE system is coupled. A test current signal can be injected into each of the wires at the ATE system to test each of the wires for the ground fault condition. In some examples, a resistive coupling is established between a wire of the ATE system and the local ground, thereby causing the ground fault condition. The test current signal can flow via the resistive coupling to the ground fault detection system. The ground fault detection system can be configured to process the test current signal to provide an indication of the ground fault condition. In some examples, unwanted level of capacitive coupling can be also be detected between active lines and/or the ground. As an example, pinched wires that can have high resistive attributes that cannot register a conductive fault, will fault due to high capacitive values as an alternating current (AC) signal couples into the local ground or another wire.

In additional or alternative examples, a resistive coupling can be established between the conductive element of the electrical device and the local ground. By way of example, during fabrication of the electrical device, a physical defect can result in the conductive element of the electrical device, such as a corresponding pin, a conducting layer or a metal trace being coupled to the local ground (e.g., via a portion of a device interface board (DIB) of the ATE coupled to the local ground). The defective conductive element can become coupled to the local ground, thereby establishing a resistive coupling between the defective conductive element of the electrical device and the local ground. The coupling of the defective conductive element of the electrical device to the local ground establishes a resistive coupling there between. If the conductive element of the electrical device that is defective is to receive the test current signal, the test current signal can flow via the resistive coupling to the local ground, and thereby to the ground fault detection system that is coupled to the local ground. The ground fault detection system can be configured to process the test current signal to provide the indication of the ground fault condition.

Accordingly, by configuring the ATE system with the ground fault detection system as described herein, ground fault conditions caused by wires of the ATE system or by the electrical device under test by the ATE system can be readily detected. Thus, the ground fault detection system enables a user (e.g., ATE or test personnel) to identify defects in the ATE system, such as wiring, and the electrical device (e.g., DUT). In some examples, the ground fault detection system can output the fault alert signal to a computing system (e.g., a computing device, a tablet, a host computer, etc.) to provide the indication of ground fault (e.g., on a display). In response to alerting the user, the user can visually inspect each of the wires to confirm that the ground fault condition is not being caused by the wires, and thus determine that the ground fault condition is being caused by the electrical device.

In some examples, the ground fault detection system can be configured to test each of the wires and notify the user as to which wire can be causing the ground fault condition. In these examples, the ground fault detection system can include a switching device (e.g., a multiplexor, etc.) that enables the ground fault detection system to step through each of the wires for a ground fault condition by providing the test current signal sequentially over the wires. In response to the ground fault detection system detecting the ground fault condition with respect to a given wire, the ground fault detection system can communicate with the ATE system. The ATE system can alert the user that the given wire is causing the ground fault condition. In some examples, in response to determining which wire of the wires is causing the ground fault condition, the user can take corrective actions to remove the ground fault condition (e.g., patch the wire, employ a new wire, etc.). By configuring the ATE system with the ground fault detection system as described herein manual testing of each individual wire for current leakage and grounding shorts can be avoided.

FIG. 1 illustrates an example of an automatic testing equipment (ATE) system environment 100. In some examples, the ATE environment 100 includes an ATE system 102 for testing an electrical device 104. The ATE system 102 can include a host computer 106. The host computer 106 can correspond to a personal computer, a tablet, or any computing platform. The host computer 106 can include a processor 108 and a memory 110 having stored therein test program code 112. The processor 108 can execute the stored test program code 112 to implement electrical testing of the electrical device 104. In some examples, the stored test program code 112 can be executed to test the ATE system 102, such as one or more wires of the ATE system, and the electrical device 104 for a ground fault condition, as described herein.

The ATE system 102 can include a test head 114. In some examples, the test head 114 has a metal housing. In additional or alternative examples, the test head 114 can include a local ground 116. In these examples, the local ground 116 can correspond to the metal housing of the test head 114. The test head 114 can include a test instrument 118. For brevity and clarity purposes, the test head 114 is illustrated in the example of FIG. 1 as including a single test instrument 118. In other examples, the test head 114 can include a plurality of test instruments 118. Each of the test instruments 118 can be coupled to the local ground 116. In some examples, each of the test instruments 118 can include a source circuit 120 and a measure circuit 122. By way of example, the source circuit 120 can correspond to a current source. In some examples, the current source is a bidirectional current source.

Under control of the test program code 112, the source circuit 120 can be configured to generate a test signal 124. The source circuit 120 can be coupled via a wire 126 to a device interface board (DIB) 128. The DIB 128 can be coupled (e.g., conductively coupled) to test pins 130. Further, the DIB 128 can be coupled to the local ground 116, as illustrated in FIG. 1. At least some of the test pins 130 can be coupled to the local ground 116 via the DIB 128. In some examples, at least a portion of a surface 132 of the DIB 128 (e.g., an outer trace layer of the DIB 128), such as surrounding the test pins 130 can be coupled to the local ground 116. As illustrated in FIG. 1, the electrical device 104 can be coupled to the test pins 130. In some examples, the test pins 130 can correspond to contact pads 130 (e.g., for pogo pin connection or an electrical device socket pin contact pin connection, etc.). The electrical device 104 being tested can be referred to a device under test (DUT) 104. By way of example, the electrical device 104 can include an electrical system, an integrated circuit (IC), a discrete circuit, for example, a transistor, a populated circuit board, a bare circuit board, etc. Thus, in some examples, the DIB 128 can be constructed to meet both mechanical and electrical requirements of the electrical device 104 and the ATE system 102. By way of example, the electrical device 104 can be coupled to the test pins 130 by positioning one or more pins of the electrical device 104 in electrical contact (e.g., directly or indirectly) with the test pins 130.

The DIB 128 can provide an electrical connection for each test instrument 118 to the electrical device 104 to enable testing of the electrical device 104. Thus, each test instrument 118 can provide the test signal 124 via the wire 126 to the electrical device 104 for testing, such as for the ground fault condition testing, as described herein. In some examples, the test signal 124 is an analog signal or a digital signal. The test signal 124 can be in a Nano amperes (nA) range. In further examples, the DIB 128 can be coupled via a wire 134 to the measure circuit 122. In response to the test signal 124, the electrical device 104 can provide a measure signal over the wire 134 to the measure circuit 122. The measure signal can be either an analog measure signal or a digital measure signal. The measure circuit 122 can be configured to receive the measure signal and convert the measure signal to measure data. The measure data can be transmitted by test instrument 118 to the host computer 106 for display thereon (e.g., on a display).

By way of example, the test program code 112 can include instructions for setup and control of each test instrument 118, instructions for generating each test signal 124 (e.g., an amplitude, a frequency, a duration, a duty cycle, etc.), instructions for capturing the measure signal, instructions for processing the measure signal, instructions for transferring the measure data generated based on the measure signal to the host computer 106, instructions for processing the measure data at the host computer 106 (e.g., such as for displaying on a display).

In some examples, the test program code 112 can include instructions for testing each of the wires 126, 134 of the ATE system 102 or the electrical device 104 for the ground fault condition. By way of example, the test program code 112 can control the source circuit 120 to generate the test signal 124 with a given frequency (e.g., at about 6 kilohertz (kHZ). In some examples, the test signal 124 is a current test signal 124. The current test signal 124 can be supplied via the wire 126 to the DIB 128. In some examples, the test signal can be supplied via the wire 134 (e.g., to test a return path wire 134 for the ground fault condition). Thus, in these examples, a switching device 136 (e.g., a multiplexor, signal routing system, etc.) can be employed between the DIB 128 and each test instrument 118. The switching device 136 can be controlled based on the test program code 112 to test each of the wires 126, 134 for the ground fault condition. As such, the test program code 112 can include instructions for controlling the switching device 136, such that the test current signal 124 can be provided to the wire 134 coupling the measure circuit 122 to the DIB 128, as illustrated in FIG. 1. As such, the test program code 112 can be employed to test each of the wires 126, 134 for the ground fault condition.

In some examples, the test program code 112 can be executed by the processor 108 to provide switching device control data to the test instrument 118. The test instrument 118 can process the switching device control data to sequentially test each of the wires 126, 134 coupled to the test instrument 118 by providing the test current signal 124 over each of the wires 126, 134 in a successive order. For example, the test instrument 118 can output the test current signal 124 and control the switching device 136 based on the switching device control data to route the test current signal through the switching device 136 to a given wire 126, 134 to test the given wire 126, 134 for the ground fault condition. In other examples, the host computer 106 can control the switching device 136 to test each of the wires 126, 134 for the ground fault condition. In these examples, the host computer 106 can include a bus interface board (not shown in FIG. 1) for providing control signaling to the switching device 136 to control which wire 126, 134 is to receive the test current signal 124 for the ground fault condition testing.

In additional or alternative examples, the switching device 136 may be omitted and the source circuit 120 and the measure circuit 122 can be coupled via respective wires 126, 134 to the DIB 128. In these examples, the wire 134 may be tested by providing the test current signal 124 to the electrical device 104 and receiving the measure signal within a given period of time. For example, the test current signal 124 can be provided over the wire 126 to the electrical device 104. The electrical device 104 can generate the measure signal based on the test current signal 124. In response to the measure circuit 122 not receiving the measure signal within the given period of time via the wire 134 can be indicative that the wire 134 has the ground fault condition.

In some examples, the ground fault condition can be caused by one of the wires 126, 134 coming into contact with the local ground 116. For example, one of the wires 126, 134 can become degraded (e.g., from wear and use), such that a conductor of the wire 126, 134 becomes visible. The visible conductor of the wire 126, 134 can come into contact (e.g., touch, such as directly or indirectly) with the local ground 116. In additional or alternative examples, an exposed end of the conductor of the wire 126, 134 (e.g., a connecting end of the conductor of the wire 126, 134 that is to engage a connecting end of the DIB 128) can come into contact with the local ground 116. Accordingly, by coming into contact with the local ground 116, a resistive coupling 138 can be established between the conductor of the wire 126, 134 and the local ground 116. The resistive coupling 138 can establish an electrical path for the test current signal 124 to the local ground 116, as illustrated in FIG. 1 (e.g., with a dashed line).

In some examples, the resistive coupling 138 is not present between the conductor of the wire 126, 134 and the local ground 116. In these examples, the test current signal 124 does not flow to the local ground 116 via the electrical path established by the resistive coupling 138. In such examples, the wire 126, 134 can be coupled to the DIB 128, and thus provide the test current signal 124 via conductive traces of the DIB 128 (not shown in FIG. 1) to a test pin of the test pins 130 with which a corresponding pin of the electrical device 104 can be in electrical contact. In some examples, the electrical device 104 can have a physical defect, such as a defect in the corresponding pin, a conducting layer or a metal trace (e.g., signal path).

By way of example, the physical defect can result in a conductive element of the electrical device 104, such as the corresponding pin, the conducting layer or the metal trace coming into contact with the grounded surface portion 132 of the DIB 128 that is coupled to the local ground 116. For example, if the conductive element is defective and the defect causes the conductive element to physically contact the grounded surface portion 132 of the DIB 128, a resistive coupling 140 can be established between the conductive element of the electrical device 104 and the local ground 116. In some examples, the grounded surface portion 132 is a metal plate supporting the electrical device 104. In some examples, the test pin of the test pins 130 with which the corresponding pin of the electrical device 104 is in electrical contact can be coupled to the local ground 116. In these examples, if the corresponding pin of the electrical device 104 was not designed to be grounded, the resistive coupling 140 can be established to the local ground 116. If the conductive element of the electrical device 104 that is defective is to receive the test current signal 124, and the resistive coupling 140 is established, the test current signal 124 can flow via the resistive coupling 140 to the local ground 116, as illustrated in FIG. 1 (e.g., with a dashed line).

Accordingly, each resistive coupling 138, 140 can provide an electrical path for the test current signal 124 to enable ground fault detection with respect to each of the wires 126, 134 and the electrical device 104. In some examples the local ground 116 can have a lower impedance than the conductor of the wire 126, 134 carrying the test current signal 124 or the defective conductive element of the electrical device 104 that carries the test current signal 124, such that the test current signal 124 can flow to the local ground 116.

To detect the ground fault condition being caused by one of the wires 126, 134, or the electrical device 104, a ground fault detector 142 can be coupled to the local ground 116 to detect the test current signal 124. For example, a first input node 144 of the ground fault detector 142 can be coupled to the local ground 116. To allow for detection of the test current signal 124 by the ground fault detector 142, a second input node 146 of the ground fault detector 142 can be coupled to an earth ground 148. In some examples, the test head 114 can be coupled to the earth ground 148. By coupling the second input node 146 to the earth ground 148, a reference to the earth ground 148 can be provided for the test current signal 124 received at the first input node 144, thereby allow for detection of the test current signal 124.

In some examples, the ground fault detector 142 can be configured to process the test current signal 124 received at the first input node 144 to provide an indication of the ground fault condition. For example, the ground fault detector 142 can include a band-pass filter 150. In some examples, the band-pass filter 150 can correspond to an active band-pass filter 150. The band-pass filter 150 can be coupled to the first and second input nodes 144,146 of the ground fault detector 142. The band-pass filter 150 can be configured attenuate signals outside a given frequency range and amplify the test current signal 124 to provide an amplified test current signal 152. In some examples, the test current signal 124 can have a frequency within the given frequency range.

In some examples, the band-pass filter 150 can include a first amplification and filtering stage and a second amplification and filtering stage. The first amplification and filtering stage can be configured to pass signals within a first frequency range (e.g., from about 4 kHZ to about 8 kHZ) and amplify the passed signals by a given gain amount (e.g., raise an amplitude of the passed signals). Thus, the first amplification and filtering stage can be configured to pass and amplify the test current signal 124 and reject remaining signals with frequencies outside the first frequency range. The second amplification and filtering stage can be configured to further amplify the test current signal 124 to produce the amplified test current signal 152. The second amplification and filtering stage can be configured to pass and amplify signals within a second frequency range (e.g., from about 5 kilohertz kHZ to about 7 kHZ). The second frequency range can be narrower in frequency band than the first frequency range. In some examples, the second frequency range can be a portion of frequencies within the first frequency range. The amplified test current signal 152 can have an amplitude that is greater than an amplitude of the test current signal 124. In some examples, the amplified test current signal 152 is in a millivolts (mV) range.

Accordingly, each of the first and second amplification and filtering stages can be being configured to gain (e.g., amplify) the test current signal 124, such that the amplified test current signal 152 has a signal-to-noise (SNR) ratio greater than a reference SNR to enable detection of the test current signal 124 at a comparator circuit 154 of the ground fault detector 142. As such, the band-pass filter 150 can be configured to amplify in-band ultra-low signal levels (e.g., signals in a nA range) to detect signals (e.g., the test current signals 124) leaking out from the wires 126, 134 or at the electrical device 104. In some examples, the band-pass filter 150 can have a narrow pass band (e.g., A quality-factor (Q-factor) greater than about 3.5), such that out-of-band signals can be rejected (e.g., attenuated), while raising an in-band gain of the detected signals sufficiently, such that the detected signals can have an amplitude greater than a noise floor.

In further examples, the comparator circuit 154 can be coupled to the band-pass filter 150 and configured to receive the amplified test current signal 152. The comparator circuit 154 can be coupled to the output node 156. The comparator circuit 154 can be configured to compare the amplified test current signal 152 to a reference voltage (e.g., 50 mV) and output a fault alert signal 158 at the output node 156 to provide the indication of the ground fault condition based on the comparison.

In some examples, each of the wires 126, 134 can be tested in turn for ground fault conditions. For example, the test program code 112 can be configured to control the test instrument 118 and the switching device 136 to provide the test current signal 124 to each of the wires 126, 134 for testing of each of the wires for ground fault conditions. Although FIG. 1 illustrates two wires 126, 134, in other examples a plurality of wires, and thus a plurality of test instruments may be employed. The switching device 136 can be scaled and configured to provide the test current signal 124 to each wire of each test instrument for fault condition testing of the wires. Accordingly, each of the wires 126, 134 can be checked in less time (e.g., a couple of minutes), as opposed, to manual wire testing for ground fault conditions, which will take a greater amount of time (e.g., hours or days). In some examples, the ground fault detector 142, the switching device 136 and the test program code 112 for ground fault condition testing of the wires 126, 134 can be referred to as a ground fault detection system. In some examples, the ground fault detection system is the ground fault detector 142. Although FIG. 1 illustrates the switching device 136 as part of the test head 114, in other examples, the switching device 136 can be external to the test head 114 or the ATE system 102.

Accordingly, by configuring the ATE system 102 with the ground fault detection system, ground fault conditions caused by the one or more wires 126, 134 of the ATE system 102 or the electrical device 104 can be readily detected. Thus, the ground fault detection system enables a user (e.g., ATE or test personnel) to identify defects with respect to the ATE system 102, such as wiring, and the electrical device 104 (e.g., a DUT). In some examples, the ground fault detection system can output the fault alert signal 158 (e.g., to a computing device, tablet, etc.) to provide the indication of ground fault.

For example, the fault alert signal 158 can be supplied to the host computer 106 to alert the user that there is a ground fault condition. In some examples, the host computer 106 can identify which wire of the wires 126, 134 is causing the ground fault condition based on the switching device control data. For example, if the switching device control data is indicative that the wire 126 of the wires 126, 134 is to be tested, and the fault alert signal 158 is generated by the ground fault detection system, the host computer 106 can notify the user that the wire 126 is causing the ground fault condition. As such, in some examples, a particular wire causing the ground fault condition can be quickly identified by the host computer and alert the user. In further examples, the user can visually inspect the wires 126, 134 to confirm that the ground fault condition is being caused by the wire 126, 134 being tested. If the user confirms that the ground fault condition is not being caused by the tested wire 126, 134, in some examples, this can be indicative that the ground fault condition is being caused by the electrical device 104. In some examples, in response to determining which wire of the wires 126, 134 is causing the ground fault condition, the user can take corrective actions to remove the ground fault condition (e.g., patch the wire, employ a new wire, etc.).

Figure 2:
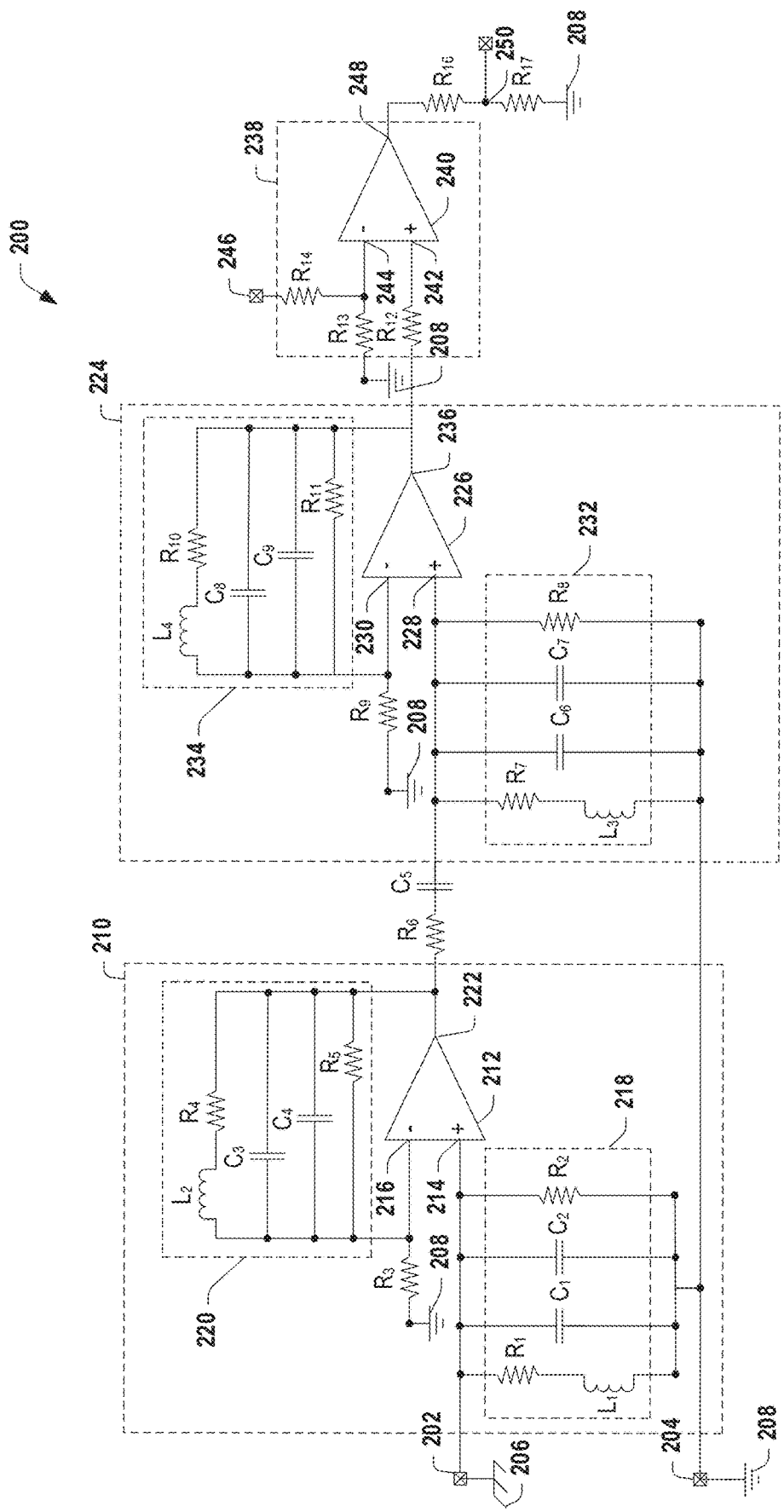
FIG. 2 illustrates an example of a ground fault detector.

FIG. 2 illustrates an example of a ground fault detection circuit 200. In some examples, the ground fault detection circuit 200 can correspond to the ground fault detector 142, as illustrated in FIG. 1. The ground fault detection circuit 200 can include a first input node 202 and a second input node 204. In some examples, the first and second input nodes 202, 204 can correspond to the first and second input nodes 144, 146, respectively, as illustrated in FIG. 1. The first input node 202 can be coupled to a local ground 206 of a housing (e.g., the local ground 116, as illustrated in FIG. 1). In some examples, the test head can be a metal housing and function as the local ground 206. The second input node 204 can be coupled to an earth ground 208 (e.g., the earth ground 148, as illustrated in FIG. 1). In some examples, the local ground 206 and the earth ground 208 can have different voltage potentials.

In some examples, the housing can correspond to a test head of an automatic test equipment (ATE) system, such as the test head 114, as illustrated in FIG. 1. The ATE (e.g., the ATE system 102, as illustrated in FIG. 1) can be employed to electrically test a device under test (DUT) (e.g., the electrical device 104, as illustrated in FIG. 1). The test head can include a test instrument (e.g., the test instrument 118, as illustrated in FIG. 1). Each test instrument can be coupled to the local ground 206, and can be further coupled vie one or more wires (e.g., the wires 126, 134, as illustrated in FIG. 1) to a device interface board (DIB) (e.g., the DIB 128, as illustrated in FIG. 1). The DIB can be coupled to the local ground 206. In some examples, the DIB can include a metal test plate on which the DUT can be placed. The metal test plate can be coupled to the local ground 206. The DUT can be coupled to the DIB (e.g., via test pins, such as the test pins 130, as illustrated in FIG. 1) for testing of the DUT. At least some of the pins of the DUT can be coupled to test pins of the DIB for receiving from the DUT or delivering test signals to the DUT from each test instrument. Each wire can be coupled (e.g., electrically coupled) to a corresponding test pin that can be in electrical communication with a given pin of the DUT. In some examples, at least one test instrument can include a source circuit (e.g., the source circuit 120, as illustrated in FIG. 1). In some examples, the source circuit can include a bidirectional current source.

Prior to or during DUT performance testing (e.g., functionality testing), each wire leading from each test instrument to the DIB and the DUT can be tested for a ground fault condition. To test each wire and the DUT for the ground fault condition, the source circuit can be configured to output a test current signal (e.g., the test current signal 124, as illustrated in FIG. 1) at a given frequency (e.g., at about 7 kilohertz (kHZ)). If no electrical path exists between a conductor of at least one wire or a conductive element of the DUT that is intended not be grounded relative to the local ground 206, the test current signal does not flow to the local ground 206. In these examples, the test current signal flows through the conductor of the at least one wire to the pin of the DUT.

By way of example, the conductive element of the DUT can correspond to the pin of the DUT, a conducting layer of the DUT or a metal trace (e.g., path) of the DUT. During fabrication of the DUT, the conductive element can experience a fabrication defect (e.g., a variation in tolerance, design configuration, etc.), such that once placed on the DIB the conductive element comes into contact with the local ground 206 (e.g., via the test plate or the ground surface portion 132 of the DIB 128, as illustrated in FIG. 1). The test current signal once injected onto the at least one wire can be provided via the at least one wire to the DUT. If the conductive element of the DUT has been defectively fabricated, the conductive element can come into contact with the device interface board and thus provide an electrical path for the test current signal to the local ground 206.

In some examples, the test current signal flows to the local ground 206 via a resistive coupling (e.g., the resistive coupling 138, as illustrated in FIG. 1) established between the conductor of the at least one wire and the local ground 206 or a resistive coupling (e.g., the resistive coupling 140, as illustrated in FIG. 1) established between conductive element of the DUT and the local ground 206. Because the local ground 206 has a lower impedance than the conductor carrying the test current signal or the conductive element of the DUT that carries the test current signal, the test current signal can flow to the local ground 206, and thereby to the first input node 202 coupled to the local ground 206.

In some examples, the conductor of the at least one wire can be coupled to the local ground 206, such as during degradation of the at least one wire to a level in which the conductor can become exposed. In additional or alternative examples, an exposed end of the conductor of the at least one wire can come into contact with the local ground 206, such as during DUT performance testing. In other examples, the exposed end of the conductor of the at least one wire can come into contact with the housing as a result of improper wiring during configuration (e.g., setup) of the ATE system. In further examples, the second input node 204 can be coupled to the earth ground 208. By coupling the second input node 204 to the earth ground 208, the second input node 204 can provide a reference to the earth ground 208 for the test current signal, thereby enabling detection of the test current signal by the ground fault detection circuit 200. Because the earth ground 208 is at a lower impedance relative to the local ground 206, the earth ground 208 can provide a return path for the test current signal.

In some examples, the ground fault detection circuit 200 can include a first amplification and filtering stage 210. The first amplification and filtering stage 210 can be coupled to the first input node 202 and the second input node 204. Thus, the first filtering and amplification stage 210 can be coupled to the local ground 206 and the earth ground 208. The first amplification and filtering stage 210 can be configured to pass signals within a first frequency range (e.g., from about 4 kilohertz (kHZ) to about 8 kHZ) and amplify the passed signals by a given gain amount. In some examples, the test current signal can be contaminated by noise. The term "noise" as used herein can refer to one or more signals other than the current signal being detected by the ground fault detection circuit 200. A summation of the one or more signals other than the test current signal can be representative of a noise floor (e.g., a background noise). In some examples, the test current signal can have an amplitude that is less than or equal to an amplitude of the one or more signals defining the noise floor.

The first amplification and filtering stage 210 can be configured attenuate all other signals outside the first frequency range and amplify the non-attenuated signals (e.g., to raise the amplitude of these signals above the noise floor). Thus, the first amplification and filtering stage 210 can pass the test current signal and at least some noise signals with frequencies within the first frequency range and reject remaining noise signals with frequencies outside the first frequency range. The test current signal can be amplified by the first amplification and filtering stage 210 to provide a first amplified test current signal.

The first amplification and filtering stage 210 can include a first amplifier 212 that can have a first input 214 and a second input 216. In some examples, the first input 214 can be a non-inverting input of the first amplifier 212 and the second input 216 can be an inverting input of the first amplifier 212. In other examples, the first input 214 can correspond to the inverting input of the first amplifier 212 and the second input 216 can correspond to the non-inverting input of the first amplifier 212. The first input 214 can be coupled to the first input node 202 to receive the test current signal. The first amplification and filtering stage 210 can further include a first input stage 218 and a first feedback stage 220. The first feedback stage 220 and the first input stage 218 can define a first stage resonant tuning circuit that can be configured to resonate in the first frequency range. The first input stage 218 can include a resistor $R_1$ that can be connected in series with an inductor $L_1$. The first input stage 218 can further include capacitors $C_1$ and $C_2$ and a resistor $R_2$ that can be connected in parallel with the series connected resistor-inductor $R_1$, $L_1$. Each of the resistors $R_1$, $R_2$ and the capacitors $C_1$, $C_2$ can be coupled to the first and second input nodes 202, 204 and to the first input 214 of the first amplifier 212.

In further examples, the first amplification and filtering stage 210 can include a resistor $R_3$ that can be connected in parallel with the first feedback stage 220 and to the second input 216 of the first amplifier 212. The first feedback stage 220 can include a resistor $R_4$ that can be connected in series with an inductor $L_2$. The first feedback stage 220 can further include capacitors $C_3$ and $C_4$ and a resistor $R_5$ that can be connected in parallel with the series connected resistor-inductor $R_4$, $L_2$. The first input stage 218, the first feedback stage 220, and the resistor $R_3$ can define a first Q-factor for the first amplification and filtering stage 210. The term "Q-factor" as used herein can refer to a ratio of a center frequency of a given amplification and filtering stage over a band-pass region from a lower to an upper cutoff frequency of the band-pass region. By way of further example, an output 222 of the first amplifier 212 can be coupled to a series connected resistor $R_6$ and capacitor $C_5$. In some examples, the series connected resistor $R_6$ and capacitor $C_5$ can be omitted.

In additional examples, the first amplification and filtering stage 210 can be coupled to a second amplification and filtering stage 224 via the series connected resistor $R_6$ and capacitor $C_5$. The second amplification and filtering stage 224 can be configured to receive the first amplified test current signal and noise signals not attenuated by the first amplification and filtering stage 210. In some examples, the first and second amplification and filtering stages 210, 224 can define (e.g., form) an active band-pass filter (e.g., such as the band-pass filter 150, as illustrated in FIG. 1). The second amplification and filtering stage 224 can be configured to pass and amplify signals within a second frequency range (e.g., from about 5 kilohertz kHZ to about 7 kHZ). The second frequency range can be narrower in frequency band than the first frequency range. In some examples, the second frequency range can be a portion of frequencies within the first frequency range.

The second amplification and filtering stage 224 can be configured attenuate the one or more noise signals received from the first amplification and filtering stage 210 outside the second frequency range and amplify the first amplified test current signal (e.g., to raise the amplitude of this signal). Thus, the second amplification and filtering stage 224 can be configured pass the first amplified test current signal and reject remaining noise signals with frequencies outside the second frequency range while amplifying the first amplified test current signal to provide a second amplified test current signal. The second amplified test current signal can have an amplitude that is greater than an amplitude of the first amplified test current signal. The amplitude of the second amplified test current signal can be of a given amplitude level that enables fault detection (e.g., by a comparator 238). The second amplification and filtering stage 224 can be coupled to the second input node 204. Thus, the second filtering and amplification stage 224 can be coupled to the earth ground 208.

By way of example, the second amplification and filtering stage 224 can include a second amplifier 226 having a first input 228 and a second input 230. In some examples, the first input 228 is a non-inverting input of the second amplifier 226 and the second input 230 is an inverting input of the second amplifier 226. In other examples, the first input 228 can correspond to the inverting input of the second amplifier 226 and the second input 230 can correspond to the non-inverting input of the second amplifier 226. The first input 228 can be coupled to the series connected resistor $R_6$ and capacitor $C_5$ to receive the first amplified test current signal. The second amplification and filtering stage 224 can further include a second input stage 232 and a second feedback stage 234. The second input stage 232 and the second feedback stage 234 can define a second stage resonant tuning circuit that can be configured to resonate in the second frequency range. The second input stage 232 can include a resistor $R_7$ that can be connected in series with an inductor $L_3$. The second input stage 232 can further include capacitors $C_6$ and $C_7$ and a resistor $R_8$ that can be connected in parallel with the series connected resistor-inductor $R_7$, $L_3$.

Each of the resistors $R_7$, $R_8$ and the capacitors $C_6$, $C_7$ can be coupled to the second input node 204 and to the first input 228 of the second amplifier 226.

In further examples, the second amplification and filtering stage 224 can further include a resistor $R_9$ that can be connected in parallel with the second feedback stage 234. The second feedback stage 234 can include a resistor $R_{10}$ that can be connected in series with an inductor $L_4$. The second feedback stage 234 can further include capacitors $C_8$ and $C_9$ and a resistor $R_{11}$ that can be connected in parallel with the series connected resistor-inductor $R_{10}$, $L_4$. The second input stage 232, the second feedback stage 234, and the resistor $R_9$ can define a second Q-factor for the second filtering and amplification stage 224. In some examples, the first Q-factor for the first amplification and filtering stage 210 can be less than the second Q-factor for the second amplification and filtering stage 224. Thus, in these examples, the second amplification and filtering stage 224 can be configured to have a narrower pass band than the first amplification and filtering stage 210. The first Q-factor and the second Q-factor can collectively (e.g., in combination) define an overall Q-factor for the ground fault detection circuit 200. In some examples, the resistor $R_3$ can have a greater resistance value than the resistor $R_9$, such that the second Q-factor is greater than the first Q-factor. In further or alternative examples, the first and second input stages 218, 232 and the first and second feedback stages 220, 234 can have components (e.g., resistors, capacitors and inductors) that can have similar values (e.g., resistance, capacitance and inductance values).

Accordingly, each of the first and second amplification and filtering stages 210, 224 can be being configured to amplify the test current signal, such that the amplified test current signal can have a signal-to-noise (SNR) ratio greater than a reference SNR to enable detection of the test current signal. By way of further example, an output 236 of the second amplifier 226 can be coupled to a resistor $R_{12}$ to couple the second filtering and amplification stage 234 to a comparator circuit 238. In some examples, the resistor $R_{12}$ can form part of the comparator circuit 238. In other examples, the resistor $R_{12}$ can be omitted. The comparator circuit 238 can be configured to compare the second amplified current test signal to a reference voltage and output a fault alert signal to provide an indication of a ground fault based on the comparison.

In some examples, the comparator circuit 238 can include a third amplifier 240 having a first input 242 and a second input 244. In some examples, the first input 242 is a non-inverting input of the third amplifier 240 and the second input 244 is an inverting input of the third amplifier 240. In other examples, the first input 242 can correspond to the inverting input of the third amplifier 240 and the second input 244 can correspond to the non-inverting input of the third amplifier 240. The first input 242 of the third amplifier 240 can be coupled via the resistor $R_{12}$ to the output 236 of the second amplifier 226. The comparator circuit 238 can further include a plurality of resistors $R_{13}$, $R_{14}$ that can be connected to the second input 244 of the third amplifier 240. In further examples, a resistor $R_{13}$ can be coupled to the earth ground 208 and a resistor $R_{14}$ can be coupled to a third input node 246. In some examples, a voltage source can be coupled to the third input node 246 to provide a voltage for establishing the reference voltage at the second input 244 of the third amplifier 240. The third amplifier 240 can be configured to compare the second amplified current test signal to the reference voltage. The third amplifier 240 can be configured to output the fault alert signal (e.g., a logical high signal) at an output 248 of the third amplifier 240 in response to an amplitude of the second amplified current test signal being equal to or greater than the reference voltage. In some examples, the reference voltage can be in a millivolt (mV) reference voltage range (e.g., about 50 mV). The output of the third amplifier 240 can be coupled to series connected resistors $R_{16}$ and $R_{17}$. An output node 250 (e.g., the output node 156, as illustrated in FIG. 1) can be coupled to a connection between the series connected resistors $R_{16}$ and $R_{17}$. In some examples, at least one of the resistors of the series connected resistors $R_{16}$ and $R_{17}$ may be omitted. Accordingly, the comparator circuit 238 can be configured to compare the second amplified test current signal to the reference voltage and output the fault alert signal to provide the indication of the ground fault in response to the amplitude of the second amplified test current signal being greater than or equal to the reference voltage.

Accordingly, the ground fault detection circuit 200 allows for ground fault conditions caused by wires of the ATE system or the DUT to be readily detected. Thus, the ground fault detection circuit 200 enables a user (e.g., ATE or test personnel) to identify defects with respect to the ATE system, such as wiring, and DUT. In some examples, the ground fault detection circuit 200 can output the fault alert signal (e.g., to a computing device, tablet, etc.) to provide the indication of ground fault. A user (e.g., ATE personnel) can visually inspect the at least one wire to confirm that the ground fault condition is not being caused by the at least one wire, and thus determine that the ground fault condition is being caused by the defective DUT.

Figure 3:
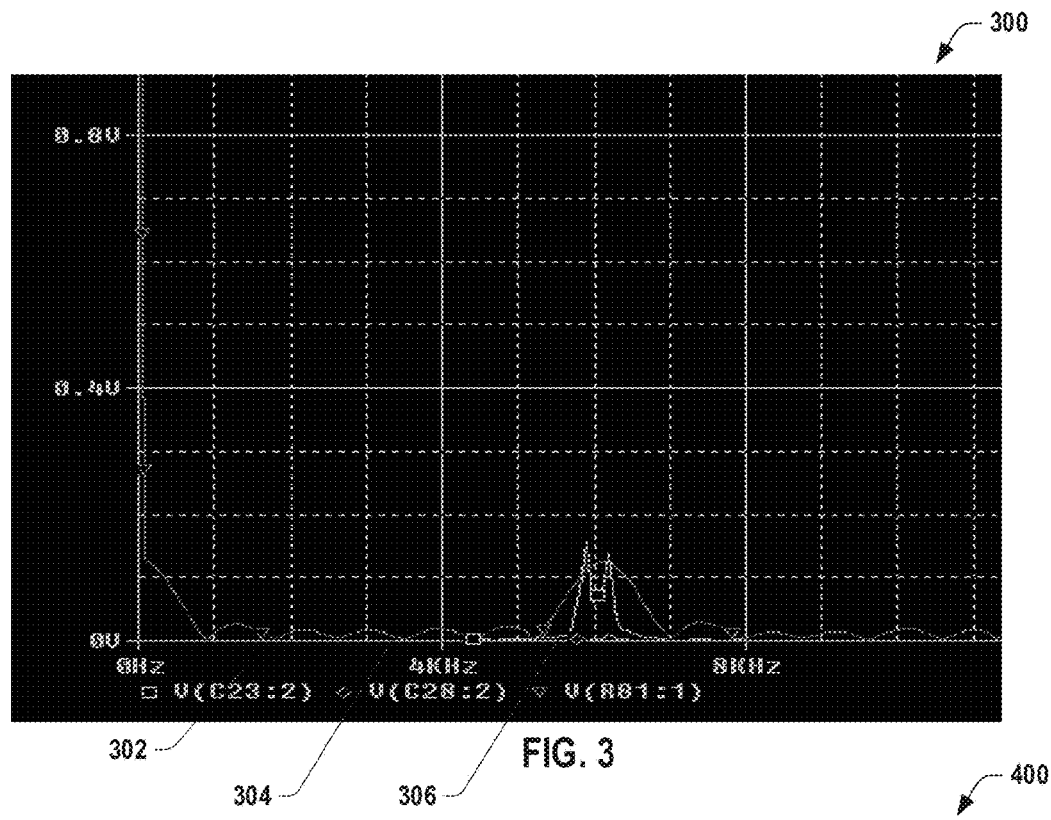
FIG. 3 illustrates an example of a frequency domain response of a ground fault detector.

FIG. 3 illustrates an example of a frequency-domain response graph 300 of a ground fault detector. In some examples, the ground fault detector can correspond to the ground fault detector 142, as illustrated in FIG. 1 or the ground fault detection circuit 200, as illustrated in FIG. 2. The frequency response graph 300 can be used to represent a frequency response of the ground fault detector. Therefore, reference may be made to the example of FIGS. 1-2 in the following description of the example of FIG. 3. In some examples, the frequency-domain response graph 300 can be obtained by transforming signals measured at circuit points during operation of the ground fault detector into a waveform in a frequency domain.

By way of example, the frequency-domain response graph 300 can include a first frequency response 302, a second frequency response 304, and a third frequency response 306. The first frequency response 302 can be provided based on the signals measured at the output 222 of the first amplifier 212. The second frequency response 304 can be provided based on the signals measured at the output 236 of the second amplifier 226. The third frequency response 306 can be provided based on the signals measured at an output node of the ground fault detector (e.g., the output node 156, as illustrated in FIG. 1 or the output node 250, as illustrated in FIG. 2). As illustrated by the frequency-domain response graph 300, the ground fault detector can have an overall high Q-factor, such that noise is attenuated by the ground fault detection circuit 200 to enable detection of a test current signal (e.g., the test current signal 124, as illustrated in FIG. 1) at the comparator circuit 238, as described herein. Accordingly, the ground fault detector can isolate the test current signal from the noise, such that ground fault conditions with respect to at least one wire of an ATE system (e.g., the wire 126, 134 of the ATE system 102, as illustrated in FIG. 1) or an electrical device (e.g., the electrical device 104, as illustrated in FIG. 1) can be readily detected.

Figure 4:
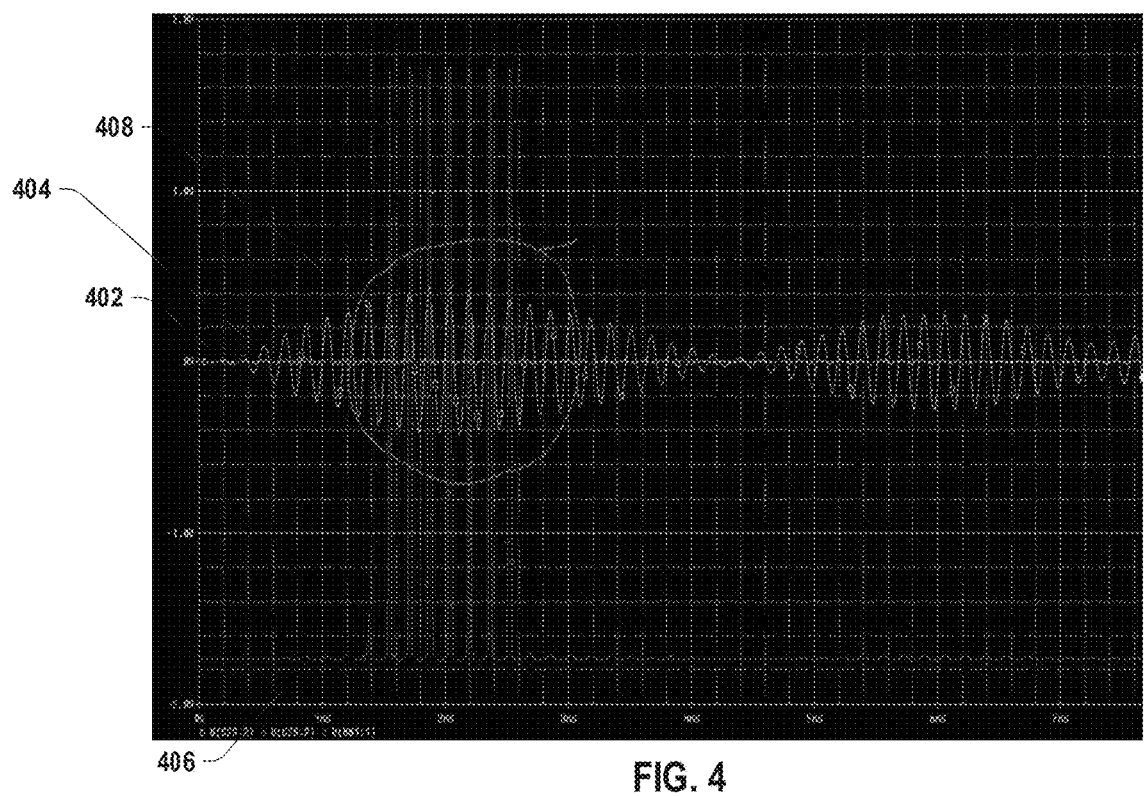
FIG. 4 illustrates an example of a time domain response of a ground fault detector.

FIG. 4 illustrates an example of a time domain response 400 of a ground fault detector. In some examples, the ground fault detector can correspond to the ground fault detector 142, as illustrated in FIG. 1 or the ground fault detection circuit 200, as illustrated in FIG. 2. The time domain response 400 can be used to represent a frequency response of the ground fault detector. Therefore, reference may be made to the example of FIGS. 1-2 in the following description of the example of FIG. 4. By way of example, the time-domain response graph 400 can include a first signal response 402, a second signal response 404, and a third signal response 406. The first signal response 402 can be provided based on signals measured at the output 222 of the first amplifier 212. The second signal response 404 can be provided based on the signals measured at the output 236 of the second amplifier 226. The third signal response 406 can be provided based on the signals measured at an output node of the ground fault detector (e.g., the output node 156, as illustrated in FIG. 1 or the output node 250, as illustrated in FIG. 2).

As illustrated by a circle 408 in the example of FIG. 4, the signals (e.g., the test current signal 124) has sufficient gain to trigger the comparator circuit 238 and thus enable detection of the test current signal. Accordingly, the ground fault detector can amplify the test current signal to a level that allows for detection of the test current signal at the comparator circuit 238, such that ground fault conditions with respect to at least one wire of an ATE system (e.g., the wire 126, 134 of the ATE system 102, as illustrated in FIG. 1) or an electrical device (e.g., the electrical device 104, as illustrated in FIG. 1) can be readily detected.

Figure 5:
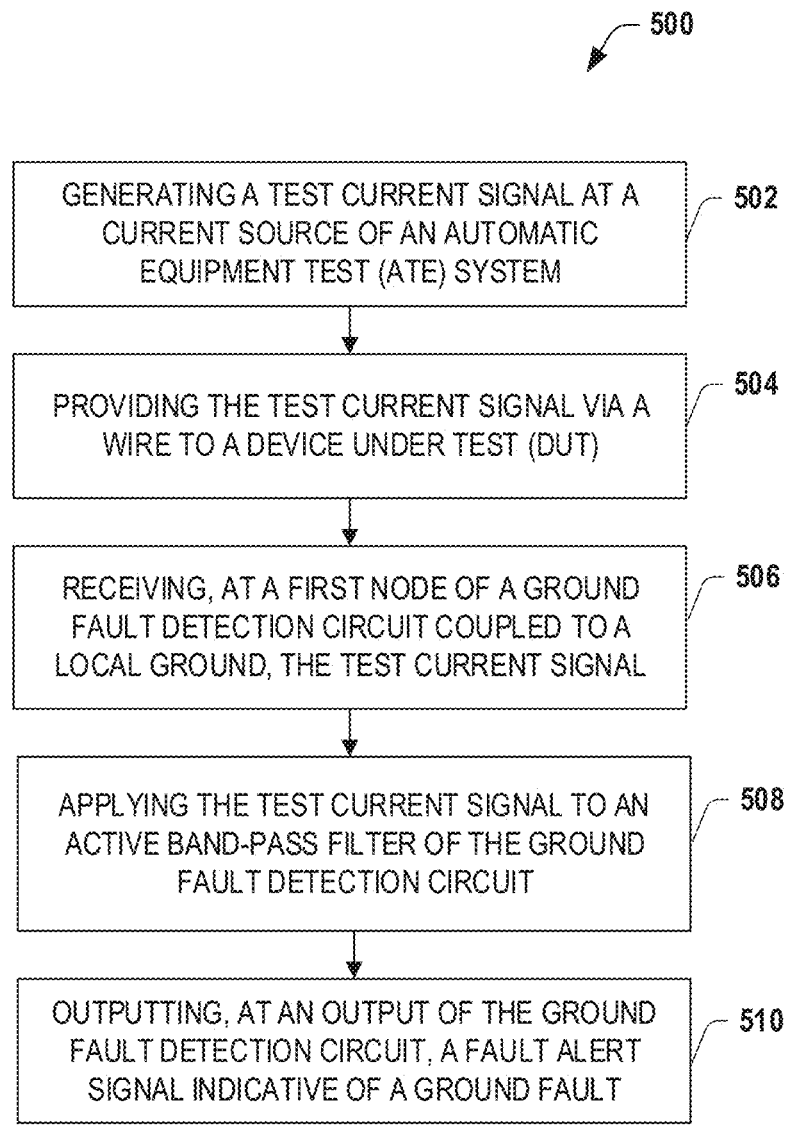
FIG. 5 illustrates an example of a method for ground fault detection.

In view of the foregoing structural and functional features described above, example methods will be better appreciated with references to FIG. 5. While, for purposes of simplicity of explanation, the example method of FIG. 5 is shown and described as executing serially, it is to be understood and appreciated that the example method is not limited by the illustrated order, as some actions could in other examples occur in different orders, multiple times and/or concurrently from that shown and described herein.

FIG. 5 illustrates an example of a method 500 for ground fault detection. The method can be implemented by a ground fault detection system, such as the ground fault detection implemented with respect to FIG. 1. The method 500 can begin at 502, by generating, at a current source of an automatic equipment test (ATE) system, a test current signal having a given frequency. In some examples, the ATE system can correspond to the ATE system 102, as illustrated in FIG. 1. The test current signal can correspond to the test current signal 124, as illustrated in FIG. 1. At 504, providing the test current signal via a wire (e.g., the wire 126, 134, as illustrated in FIG. 1) to a device under test (DUT) (e.g., the electrical device, as illustrated in FIG. 1) coupled to a test head (e.g., the test head 114, as illustrated in FIG. 1) of the ATE system.

At 506, receiving, at a first input node (e.g., the first input node 144, as illustrated in FIG. 1) of a ground fault detection circuit (e.g., the ground fault detector 142, as illustrated in FIG. 1) coupled to a local ground (e.g., the local ground 116, as illustrated in FIG. 1) of the ATE system, the current signal in response to one of a coupling (e.g., the resistive coupling 138, as illustrated in FIG. 1) of a conductor of the at least one wire carrying the test current signal to the local ground and a coupling (e.g., the resistive coupling 140, as illustrated in FIG. 1) of a conductive element of the DUT carrying the test current signal to the local ground. The ground fault detection circuit can include a second input node (e.g., the second input node 146, as illustrated in FIG. 1) that can be coupled to an earth ground (e.g., the earth ground 148, as illustrated in FIG. 1) to provide a signal reference for the test current signal. The test current signal can be contaminated with noise.

At 508, applying the test current signal to an active band-pass filter (e.g., the band-pass filter 150, as illustrated in FIG. 1) of the ground fault detection circuit to attenuate the noise and provide an amplified test current signal (e.g., the amplified test current signal 152, as illustrated in FIG. 1). The frequency of the test current signal can be within a band-pass frequency range of the band-pass filter. At 510, outputting, at an output (e.g., the output node 156, as illustrated in FIG. 1) of the ground fault detection circuit, a fault alert signal (e.g., the fault alert signal 158, as illustrated in FIG. 1) indicative of a ground fault condition based on a comparison of the second amplified current signal relative a voltage threshold.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A ground fault detection circuit comprising:
a band-pass filter comprising:
a first input node, and a second input node, and a resonant tuning circuit, the first input node being directly coupled to a local ground of a test head of an automatic test equipment (ATE) system for an electrical device that is coupled via at least one wire to a test instrument of the ATE, the second input node being directly coupled to an earth ground wherein the local ground and the earth ground have different electrical potentials, the band-pass filter being configured to pass and amplify a test current signal established at the first input node in response to one of a coupling of a conductor of the at least one wire carrying the test current signal to the local ground, and a coupling of a conductive element of the electrical device carrying the test current signal to the local ground, wherein the first input node and the second input node are coupled directly to the resonant tuning circuit, and the resonant tuning circuit is configured to resonate in a frequency range that includes the test current signal; wherein
the band-pass filter comprises a first amplification and filtering stage and a second amplification and filtering stage,
the first amplification and filtering stage comprising:
a first input stage;
a first feedback stage; and
a first amplifier, wherein
the resonant tuning circuit comprises the first input stage and the first feedback stage; and
a comparator circuit configured to compare an amplified test current signal to a voltage threshold and output a fault alert signal to provide an indication of a ground fault based on the comparison.

2. A ground fault detection circuit comprising:
a band-pass filter comprising a first node and a second node, the first node being coupled to a local ground of a test head of an automatic test equipment (ATE) system for an electrical device that is coupled via at least one wire to a test instrument of the ATE, the second node being coupled to an earth ground, the band-pass filter being configured to pass and amplify a test current signal established at the first node in response to one of a coupling of a conductor of the at least one wire carrying the test current signal to the local ground, and a coupling of a conductive element of the electrical device carrying the test current signal to the local ground; and
a comparator circuit configured to compare an amplified test current signal to a voltage threshold and output a fault alert signal to provide an indication of a ground fault based on the comparison, wherein the band-pass filter comprises a first amplification and filtering stage and a second amplification and filtering stage,
the first amplification and filtering stage comprising:
a first input stage;
a first feedback stage; and
a first amplifier, wherein the first amplification and filtering stage is configured to pass and amplify test current signals within a first frequency range, and the first amplification and filtering stage is coupled to the first input node and the second input node;
the second amplification and filtering stage comprising:
a second input stage;
a second feedback stage; and
a second amplifier, wherein the second amplification and filtering stage is configured to pass and amplify test current signals within a second frequency range, and the second amplification and filtering stage is coupled to an output of the first amplification and filtering stage, the second input node, and an input of the comparator circuit.

3. The ground fault detection circuit of claim 2, wherein the second frequency range is narrower in frequency band than the first frequency range.

4. The ground fault detection circuit of claim 3, wherein the second frequency range is a portion of frequencies within the first frequency range.

5. The ground fault detection circuit of claim 2, wherein the first amplifier of the first amplification and filtering stage has a first input and a second input, the first input being coupled to the first input node, and the first input stage and the first feedback stage define a first stage resonant tuning circuit configured to resonate in the first frequency range, the first stage resonant tuning circuit being coupled to both the first input node and the second input node.

6. The ground fault detection circuit of claim 5, wherein the first feedback stage is coupled to an output of the first amplifier and the second input of the amplifier, the first input stage being coupled to the first input of the amplifier.

7. The ground fault detection circuit of claim 6, wherein the first amplification and filtering stage further comprises a resistor coupled to the second input of the amplifier, the first feedback stage, the first input stage, the first amplification and filtering stage having a first Q-factor that is greater than a second Q-factor for the second amplification and filtering stage.

8. The ground fault detection circuit of claim 7, wherein the second amplifier of the second amplification and filtering stage has a first input and a second input, the first input of the second amplifier being coupled to the output of the first amplifier, the second input stage and the second feedback stage of the second amplification and filtering stage defining second stage resonant tuning circuit configured to resonate in the second frequency range, the second stage resonant tuning circuit being coupled to the second input node.

9. The ground fault detection circuit of claim 8, wherein the second feedback stage of the second amplification and filtering stage is coupled to an output of the second amplifier and the second input of the second amplifier, the second input stage of the second amplification and filtering stage being coupled to the first input of the second amplifier and the output of the first amplifier.

10. The ground fault detection circuit of claim 9, wherein the resistor is a first resistor, the second amplification and filtering stage further comprises a second resistor coupled to the second input of the second amplifier, and the second feedback stage, the second input stage.

11. The ground fault detection circuit of claim 10, wherein, the comparator circuit comprises a third amplifier having a first input and a second input, the input of the comparator circuit is the first input, and the first input is coupled to the output of the second amplifier and the second input is coupled to a series connected resistor network defining the voltage threshold.

12. The ground fault detection circuit of claim 2, wherein the electrical device is a device under test (DUT), the DUT being coupled to the test head of the ATE for receiving the test current signal.

13. The ground fault detection circuit of claim 12, wherein the conductive element of the DUT has a physical defect, such that the coupling of the DUT to the test head provides an electrical path from the conductive element of the DUT to the local ground for the test current signal.

14. The ground fault detection circuit of claim 13, wherein the test current signal is generated by a bidirectional current source.

15. A method for detecting a ground fault condition, the method comprising:
generating, at a current source of an automatic equipment test (ATE) system, a test current signal having a given frequency;
providing the test current signal via at least one wire to a device under test (DUT) coupled to a test head of the ATE system;
receiving, at a first input node of an active band-pass filter of a ground fault detection circuit directly coupled to a local ground of the ATE system, the test current signal in response to one of a coupling of a conductor of the at least one wire carrying the test current signal to the local ground and a coupling of a conductive element of the DUT carrying the test current signal to the local ground, wherein the active band-pass filter comprises a second input node that is coupled directly to an earth ground to provide a signal reference for the test current signal, wherein the test current signal is contaminated with noise, wherein the local ground and of the ATE system and the earth ground have different electrical potentials;
applying the test current signal to the active band-pass filter of the ground fault detection circuit to attenuate the noise and provide an amplified test current signal, wherein the frequency of the test current signal is within a band-pass frequency range of the band-pass filter; and outputting, at an output of the ground fault detection circuit, a fault alert signal indicative of a ground fault condition based on a comparison of the second amplified test current signal relative a voltage threshold, wherein the active band-pass filter comprises a first amplification and filtering stage and a second amplification and filtering stage;

the first amplification and filtering stage comprising:
a first input stage;
a first feedback stage; and
a first amplifier, wherein the first amplification and filtering stage is configured to pass and amplify test current signals within a first frequency range, and the first amplification and filtering stage is coupled to the first input node and the second input node;

the second amplification and filtering stage comprising:
a second input stage;
a second feedback stage; and
a second amplifier, wherein the second amplification and filtering stage is configured to pass and amplify test current signals within a second frequency range, and the second amplification and filtering stage is coupled to an output of the first amplification and filtering stage, the second input node, and an input of a comparator circuit.

16. A system comprising:
a current source configured to generate a test current signal, the test current signal being supplied via at least one wire to a device under test (DUT) coupled to a test head of an automatic test equipment (ATE) system;
a ground fault detector comprising an active band-pass filter with a first input node directly coupled to a local ground of the test head, the active band-pass filter having a second input node directly coupled to an earth ground, wherein the local ground and the earth ground have different electrical potentials, the ground fault detector being configured to receive the test current signal in response to one of a coupling of a conductor of the at least one wire carrying the test current signal to the local ground and a coupling of a conductive element of the DUT carrying the test current signal to the local ground, the ground fault detector being further configured to output a fault alert signal to provide an indication of a ground fault based on the test current signal, wherein the active band-pass filter comprises a first amplification and filtering stage and a second amplification and filtering stage;

the first amplification and filtering stage comprising:
a first input stage;
a first feedback stage; and
a first amplifier, wherein the first amplification and filtering stage is configured to pass and amplify test current signals within a first frequency range, and the first amplification and filtering stage is coupled to the first input node and the second input node;

the second amplification and filtering stage comprising:
a second input stage;
a second feedback stage; and
a second amplifier, wherein the second amplification and filtering stage is configured to pass and amplify test current signals within a second frequency range, and the second amplification and filtering stage is coupled to an output of the first amplification and filtering stage, the second input node, and an input of a comparator circuit.

17. The ATE system of claim 16, wherein the first input node of the active band-pass filter is configured to receive the test current signal and the second input node of the active band-pass filter coupled to the earth ground provides a signal reference for the test current signal.

18. The ATE system of claim 17, wherein the test current signal has a given frequency, and the active band-pass filter is configured to resonate in a frequency range that includes the given frequency of the test current signal, the active band-pass filter being configured to pass and amplify the test current signal; and
a comparator circuit configured to compare an amplified test current signal to a voltage threshold and output the fault alert signal to provide the indication of the ground fault based on the comparison.

19. The ATE system of claim 18, wherein the active band-pass filter comprises a first amplification and filtering stage having a first Q-factor and a second amplification and filtering stage having a second Q-factor that is greater than the first Q-factor, each of the first and second amplification and filtering stages being configured to pass and amplify the test current signal to remove at least some of the noise contaminating the test current signal, such that the test current signal has a signal-to-noise (SNR) ratio greater than a reference SNR.

* * * * *